(12) United States Patent
Hansen et al.

(10) Patent No.: US 10,109,445 B2
(45) Date of Patent: Oct. 23, 2018

(54) PRESSURE RESISTANT HOUSING FOR SUBSEA APPLICATIONS

(71) Applicant: ABB Schweiz AG, Baden (CH)

(72) Inventors: Kai Hansen, Oslo (NO); Vitor Moritsugu, Bergen (NO); Dietmar Gentsch, Ratingen (DE); Subbaiahthever Dukkaiappan, Dusseldorf (DE)

(73) Assignee: ABB Schweiz AG, Baden (CH)

( * ) Notice: Subject to any disclaimer, the term of this patent is extended or adjusted under 35 U.S.C. 154(b) by 18 days.

(21) Appl. No.: 15/375,643

(22) Filed: Dec. 12, 2016

(65) Prior Publication Data

US 2017/0178854 A1 Jun. 22, 2017

(30) Foreign Application Priority Data

Dec. 18, 2015 (EP) .................................... 15201120

(51) Int. Cl.
*H01H 85/175* (2006.01)
*H01H 85/00* (2006.01)
(Continued)

(52) U.S. Cl.
CPC ...... *H01H 85/003* (2013.01); *H01H 85/0013* (2013.01); *H01H 85/17* (2013.01);
(Continued)

(58) Field of Classification Search
CPC ...... H05K 5/0239; H05K 5/061; H05K 5/063; H05K 5/0095; H01H 85/0021;
(Continued)

(56) References Cited

U.S. PATENT DOCUMENTS

| | | | |
|---|---|---|---|
| 3,626,123 A | 12/1971 | Pflanz et al. | |
| 4,606,368 A * | 8/1986 | McCafferty | F16K 27/062 137/15.22 |
| 5,166,677 A * | 11/1992 | Schoenberg | E21B 33/0355 166/335 |
| 5,239,446 A * | 8/1993 | Matsumura | H05K 7/1417 174/559 |
| 6,296,336 B1 * | 10/2001 | Hattori | H05K 5/061 220/378 |
| 6,561,522 B1 * | 5/2003 | Radelet | F16J 15/021 277/314 |
| 6,614,640 B2 * | 9/2003 | Richter | H01C 7/12 361/117 |
| 8,136,279 B1 * | 3/2012 | Nearman | B29C 37/0082 277/609 |
| 8,333,295 B1 * | 12/2012 | Parker | H05K 5/061 114/312 |
| 2014/0055227 A1 * | 2/2014 | Boe | H01H 85/0021 337/1 |

(Continued)

FOREIGN PATENT DOCUMENTS

| | | |
|---|---|---|
| EP | 1942514 A1 | 7/2008 |
| EP | 2565899 A1 | 3/2013 |

(Continued)

OTHER PUBLICATIONS

European Search Report Application No. 15201120.1 Completed: May 18, 2016; dated May 24, 2016 8 Pages.

*Primary Examiner* — Anatoly Vortman
*Assistant Examiner* — Jacob Crum
(74) *Attorney, Agent, or Firm* — Whitmyer IP Group LLC

(57) ABSTRACT

A pressure resistant housing for an electric component, which pressure resistant housing is adapted for use in subsea applications. The pressure resistant housing includes a first ceramic body arranged to accommodate the electric component, which first ceramic body is provided with a first opening and a second opening, a first metal lid for closing the first opening, a first annular sealing member arranged to provide a fluid tight seal between the first metal lid and the first opening, a first clamp arranged to clamp the first metal lid to the first ceramic body, a second metal lid for closing the second opening, a second annular sealing member arranged to provide a fluid tight seal between the second metal lid and the second opening, and a second clamp arranged to clamp the second metal lid to the first ceramic body.

14 Claims, 2 Drawing Sheets

(51) Int. Cl.
*H01H 85/17* (2006.01)
*H05K 5/00* (2006.01)
*H05K 5/02* (2006.01)
H01H 85/042 (2006.01)
H01H 85/165 (2006.01)
H02B 13/045 (2006.01)

(52) U.S. Cl.
CPC ......... *H01H 85/175* (2013.01); *H05K 5/0095* (2013.01); *H05K 5/0239* (2013.01); *H01H 85/0026* (2013.01); *H01H 85/042* (2013.01); *H01H 85/165* (2013.01); *H02B 13/045* (2013.01)

(58) Field of Classification Search
CPC ............. H01H 85/0026; H01H 85/003; H01H 85/0047; H01H 85/175; H01H 85/1755; H01H 85/0013; H01H 85/042; H01H 85/165; H01H 85/17; H02B 13/0145
USPC ........................................................ 337/205
See application file for complete search history.

(56) References Cited

U.S. PATENT DOCUMENTS

2014/0374132 A1* 12/2014 Boe .................... H01H 85/0013
174/50.51

FOREIGN PATENT DOCUMENTS

EP        2996131  A1   3/2016
WO     2015028141  A1   3/2015

* cited by examiner

PRESSURE RESISTANT HOUSING FOR SUBSEA APPLICATIONS

TECHNICAL FIELD

The present disclosure generally relates to subsea installations. In particular, it relates to a pressure resistant housing for an electric component.

BACKGROUND

A fuse is usually installed as a protective device in electrical systems. It protects electrical systems from short circuit and overloads. It operates by interrupting the current by evaporation or melting of a conductive material, thereby interrupting an arc.

Usually the fuses are installed in environments with 1 atmosphere pressure. Fuses can generally not withstand the increased external pressure present in subsea applications. Subsea installations may today be located at depths of up to 3000 meters. At such depths the ambient pressure is 300 bar, and such pressure may result in mechanical damage and unexpected behaviour of a fuse.

Typically in subsea applications fuses have been installed inside an oil-filled enclosure containing a particular electrical device such as a transformer or a power converter. These fuses shared the same oil volume as the electrical device, which could lead to oil contamination. Moreover, arc interrupting capabilities are dependent of the insulating medium and on the ambient pressure. Therefore for each installation depth the fuses could have different behaviour.

These problems have been addressed in for example EP2565899 which discloses a pressure resistant housing for an electric component. This document discloses a pressure resistant housing adapted for the use in a subsea application. A ceramic housing body houses the electric component. The ceramic housing body has a first opening and a second opening which are closed by a first metal lid and a second metal lid, respectively.

One disadvantage with this design is that it requires a rather complex manufacturing process which includes metallization of the edges of the openings of the ceramic housing body and soldering with the metal lids.

SUMMARY

In view of the above, an object of the present disclosure is to provide a pressure resistant housing for subsea applications, which solves or at least mitigates the problems of the prior art.

There is hence provided a pressure resistant housing for an electric component, which pressure resistant housing is adapted for use in subsea applications, wherein the pressure resistant housing comprises: a first ceramic body arranged to accommodate the electric component, which first ceramic body is provided with a first opening and a second opening, a first metal lid for closing the first opening, a first annular sealing member arranged to provide a fluid tight seal between the first metal lid and the first opening, a first clamp arranged to clamp the first metal lid to the first ceramic body, a second metal lid for closing the second opening, a second annular sealing member arranged to provide a fluid tight seal between the second metal lid and the second opening, and a second clamp arranged to clamp the second metal lid to the first ceramic body.

By means of the annular sealing members and clamps a fluid-tight design may be obtained in a simple manner. The first ceramic body may hence provide a space for an electric component, which has essentially the same hydrostatic pressure as the hydrostatic pressure at sea level.

According to one embodiment the first ceramic body has a first end flange at a first end thereof, wherein the first clamp is arranged to clamp the first metal lid to the first end flange.

According to one embodiment the first ceramic body has a second end flange at a second end thereof, wherein the second clamp is arranged to clamp the second metal lid to the second end flange.

According to one embodiment the first metal lid has a first bore arranged to receive a portion of the electric component.

According to one embodiment the first metal lid has a first circumferential groove and a first flexible member arranged in the first circumferential groove.

According to one embodiment the second metal lid has a second bore arranged to receive a portion of the electric component.

According to one embodiment the second metal lid has a second circumferential groove and a second flexible member arranged in the second circumferential groove.

Preferably, the first ceramic body has a longitudinal extension along a single axis and the first opening and the second opening are openings as opposite ends of the first ceramic body. By fitting the electric component in the first bore and in the second bore, mechanical impact on the electric component may be minimized along the axial direction of the electric component. Axial forces may in other words be minimised.

Moreover, the first flexible member and the second flexible member arranged in the first circumferential groove and in the second circumferential groove, respectively, ensure a good electrical connection between the electric component and the first metal lid and the second metal lid.

One embodiment comprises a first annular inner sealing member arranged to provide a fluid tight seal between the first metal lid and the first opening, wherein the first annular inner sealing member is arranged radially inwards of the first annular sealing member.

The additional annular sealing member, the first annular inner sealing member, which is arranged radially inwards of the first annular sealing member, provides additional safety for maintaining the pressure difference between ambient pressure and the pressure inside the first ceramic body. For example, in case the first annular sealing member is damaged and would be unable to provide a tight sealing, the first annular inner sealing member will maintain the tight sealing and thus the required pressure difference.

One embodiment comprises a second annular inner sealing member arranged to provide a fluid tight seal between the second metal lid and the second opening, wherein the second annular inner sealing member is arranged radially inwards of the second annular sealing member.

According to one embodiment the first clamp is annular.

According to one embodiment the second clamp is annular, and which second clamp has a circumferential surface provided with a through-opening to provide radial access to the second metal lid. The second metal lid may thereby be accessed for electrical connection, especially if the second metal lid is by no other means accessible for electrical connection.

According to one embodiment the first annular sealing member and the second annular sealing member are O-rings.

One embodiment comprises a second ceramic body provided with third opening and a fourth opening, a third annular sealing member arranged to provide a fluid tight seal between the second metal lid and the third opening, wherein the second clamp is arranged to clamp the first ceramic body to the second ceramic body, a support structure, a fourth annular sealing member arranged to provide a fluid tight seal between the support structure and the fourth opening, and a third clamp arranged to clamp the second ceramic body to the support structure.

The second ceramic body extends between the support structure to which the pressure resistant housing may be mounted, and the second metal lid. The metal lids, which are electrodes, may thus be adequately distanced from the support structure which generally has a different electric potential than the first metal lid and the second metal lid. The second ceramic body may hence be seen as an extension which provides additional insulation to e.g. ground.

Beneficially, the pressure resistant housing may be used to accommodate an electrical component such as a fuse. Hence, according to a second aspect of the present disclosure there is provided a subsea fuse comprising the pressure resistant housing of the first aspect, and an electric component in the form of a fuse connected to the first metal lid and to the second metal lid.

According to one embodiment the pressure resistant housing comprises a dielectric fluid in which the electric component is immersed.

Generally, all terms used in the claims are to be interpreted according to their ordinary meaning in the technical field, unless explicitly defined otherwise herein. All references to "a/an/the element, apparatus, component, means, etc. are to be interpreted openly as referring to at least one instance of the element, apparatus, component, means, etc., unless explicitly stated otherwise.

BRIEF DESCRIPTION OF THE DRAWINGS

The specific embodiments of the inventive concept will now be described, by way of example, with reference to the accompanying drawings, in which.

DETAILED DESCRIPTION

The inventive concept will now be described more fully hereinafter with reference to the accompanying drawings, in which exemplifying embodiments are shown. The inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description.

The present disclosure relates to a pressure resistant housing for subsea applications. The pressure resistant housing may for example be designed to withstand a differential pressure in the order of 10 bar, preferably in the order of 100 bar.

The pressure resistant housing is arranged to accommodate an electric component such as a fuse. The pressure resistant housing has two electric terminals for connection with the electric component. The electric terminals are formed by a first metal lid and a second metal lid. The first metal lid and the second metal lid are electrically insulated from each other, and distanced from each other. To this end, the pressure resistant housing has an electrically insulating body, a first ceramic body, which is hollow in order to accommodate the electric component. The first ceramic body has a first opening. The first metal lid is arranged to cover the first opening. The first ceramic body also has a second opening. The second metal lid is arranged to cover the second opening.

Moreover, in order to provide a fluid tight sealing, the pressure resistant housing has a first annular sealing member and a second annular sealing member. The first annular sealing member is arranged to provide a fluid tight seal between the first metal lid and the first opening. The second annular sealing member is arranged to provide a fluid tight seal between the second metal lid and the second opening.

The pressure resistant housing furthermore includes a first clamp and a second clamp. The first clamp is arranged to clamp the first metal lid to the first ceramic body. The second clamp is arranged to clamp the second metal lid to the first ceramic body.

The electric component can be placed inside the first ceramic body and connected to the first metal lid and the second metal lid to thereby provide an electrical connection between the first metal lid and the second metal lid.

Examples of the pressure resistant housing will now be described with reference to FIGS. 1 and 2.

Figure 1:
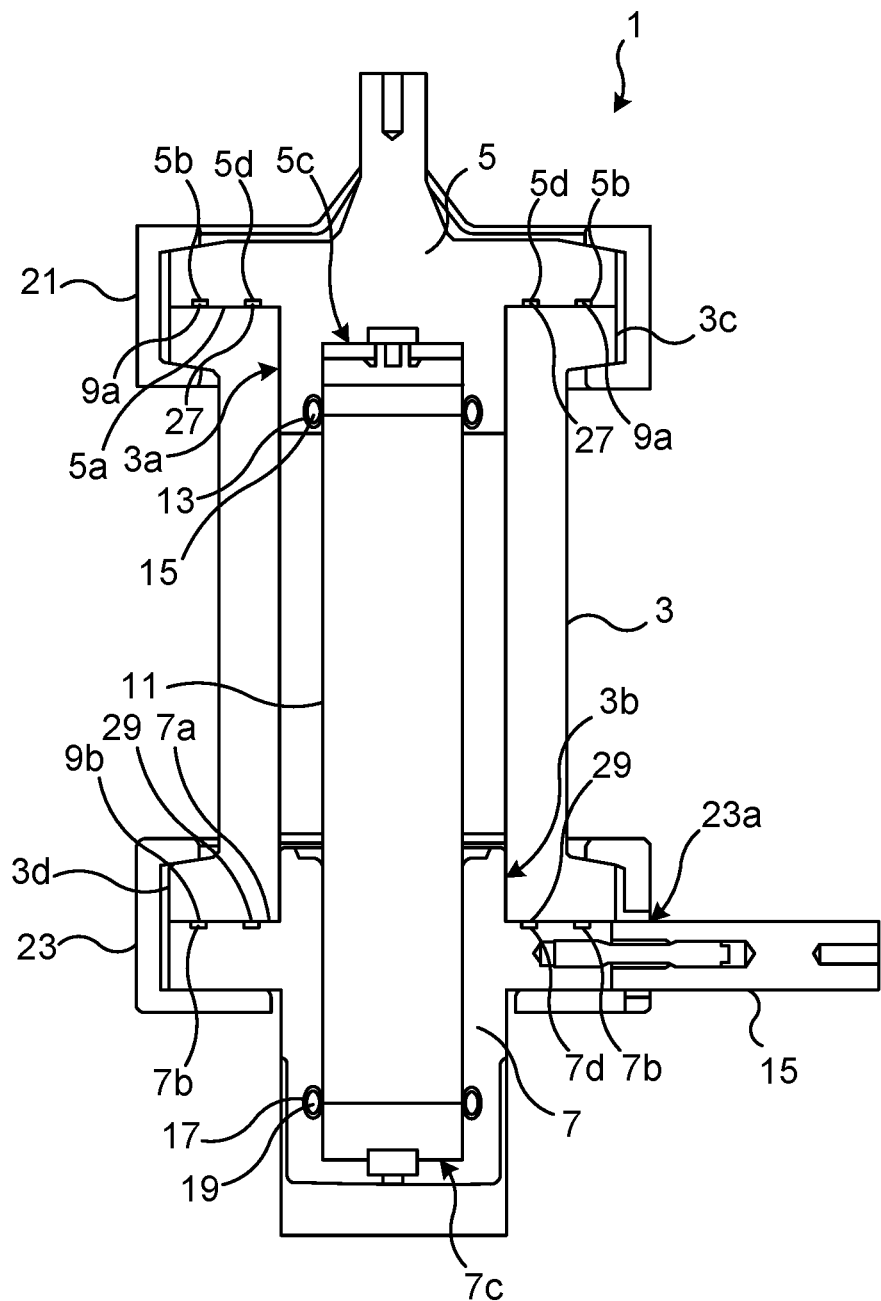
FIG. 1 schematically depicts a longitudinal section of a first example of a pressure resistant housing including an electric component.

FIG. 1 illustrates a first example of a pressure resistant housing 1.

The pressure resistant housing 1 comprises a first ceramic body 3. The first ceramic body 3 is hollow and has a first opening 3a and a second opening 3b which are connected by means of the hollow structure of the first ceramic body 3. The first opening 3a is provided at a first end of the first ceramic body 3 and the second opening 3b is provided at a second end opposite to the first end.

The first ceramic body 3 may for example have an essentially rotation symmetric body. The first ceramic body 3 may thus according to one variation be cylindrical or essentially cylindrical. Other shapes of the first ceramic body are also envisaged; the first ceramic body could for example have a rectangular or a polygonal cross-sectional shape.

The first ceramic body 3 has a first end flange 3c at a first end of the first ceramic body 3. The first ceramic body 3 has a second flange 3d at a second end, opposite to the first end, of the first ceramic body 3.

The pressure resistant housing 1 furthermore comprises a first metal lid 5 and a second metal lid 7. The first metal lid 5 is arranged to cover the first opening 3a and the second metal lid 7 is arranged to cover the second opening 3b. The first metal lid 5 forms a first electric terminal of the pressure resistant housing 1. The second metal lid 7 forms a second electric terminal of the pressure resistant housing 1.

The first metal lid 5 has a surface 5a arranged to face the first end flange 3c. The surface 5a is provided with a first groove 5b. The first groove 5b forms a closed loop extending around surface 5a. The first groove 5b is preferably elliptical.

The second metal lid 7 has a surface 7a arranged to face the second end flange 3d. The surface 7a is provided with a second groove 7b. The second groove 7b forms a closed loop extending around surface 7a. The second groove 7b is preferably elliptical.

The pressure resistant housing 1 comprises a first annular sealing member 9a arranged to provide a fluid tight seal between the first metal lid 5 and the first opening 3a. The first annular sealing member 9a is preferably made of a flexible material, such as rubber or plastic. The first annular sealing member 9a may for example be an O-ring.

The first annular sealing member 9a is arranged to be received in the first groove 5b of the first metal lid 5. The first annular sealing member 9a is hence arranged between the first metal lid 5 and the first end flange 3c of the first ceramic body 3.

The pressure resistant housing 1 comprises a second annular sealing member 9b arranged to provide a fluid tight seal between the second metal lid 7 and the second opening 3b. The second annular sealing member 9b is preferably made of a flexible material, such as rubber or plastic. The second annular sealing member 9b may for example be an O-ring.

The second annular sealing member 9b is arranged to be received in the second groove 7b of the second metal lid 7. The second annular sealing member 9b is hence arranged between the second metal lid 7 and the second end flange 3d of the first ceramic body 3.

The thickness the first annular sealing member 9a is greater than the depth of the first groove 5b of the first metal lid 5. The first metal lid 5 hence rests on the first annular sealing member 9a in the orientation of the pressure resistant housing 1 shown in FIG. 1. The thickness of the second annular sealing member 9b is greater than the depth of the second groove 7b of the second metal lid 7. The first ceramic body 3 hence rests on the second annular sealing member 9b in the orientation of the pressure resistant housing 1 shown in FIG. 1.

The first metal lid 5 furthermore has a first bore 5c arranged to receive a portion of an electric component 11. The second metal lid 7 has a second bore 7c arranged to receive another portion of an electric component 11. In an assembled state, the first bore 5c and the second bore 7c may typically be aligned along a common axis, i.e. the central longitudinal axis of the first ceramic body 3.

The first bore 5c is provided with a first circumferential groove 13. Furthermore, the pressure resistant housing 1 has a first flexible member 15 arranged in the first circumferential groove 13. The first flexible member 15 is flexible in the radial direction and is arranged to provide mechanical contact between the electric component 11 and the first metal lid 5. When installing the electric component 11, the first flexible member 15 is hence pushed radially outwards, towards the wall of the first circumferential groove 13, as the electric component is inserted into the first bore 5c to establish a mechanical and thus an electrical connection therebetween.

The second bore 7c is provided with a second circumferential groove 17. Furthermore, the pressure resistant housing 1 has a second flexible member 19 arranged in the second circumferential groove 17. The second flexible member 19 is flexible in the radial direction and is arranged to provide mechanical contact between the electric component 11 and the second metal lid 7. When installing the electric component 11, the second flexible member 19 is hence pushed radially outwards, towards the wall of the second circumferential groove 17 to establish a mechanical and thus an electrical connection therebetween.

The pressure resistant housing 1 furthermore includes a first clamp 21 and a second clamp 23. The first clamp 21 is arranged to clamp the first metal lid 5 to the first ceramic body 3, in particular to the first end flange 3c. The second clamp 23 is arranged to clamp the second metal lid 7 to the first ceramic body 3, in particular to the second end flange 3d.

The first clamp 21 may be made of an electrically conducting material such as metal. The second clamp 23 may be made of an electrically conducting material such as metal.

The first clamp 21 may be annular. The first clamp 21 may for example be made of two clamp halves that can be mounted around the periphery of the first metal lid 5 and the first end flange 3c.

The second clamp 23 may be annular. The second clamp 23 may for example be made of two clamp halves that can be mounted around the periphery of the second metal lid 7 and the second end flange 3d. The second clamp 23 may have a circumferential surface provided with a through-opening 23a extending radially through the side wall of the second clamp 23 to provide access to the second metal lid 7. An electrical conductor 25 can thereby be connected to the second metal lid 7 through the through-opening 23a. Alternatively, an electrical conductor could be connected directly to the second metal lid 7, as is the case with the first metal lid 5.

The surface 5a of the first metal lid 5 may according to one variation be provided with a second groove 5d arranged radially inwards of the first groove 5b. The second groove 5d forms a closed loop extending around surface 5a. The second groove 5d is preferably elliptical. In this case, the pressure resistant housing 1 comprises a first annular inner sealing member 27 arranged to provide a fluid tight seal between the first metal lid 5 and the first opening 3a. The first annular inner sealing member 27 is thus arranged radially inwards of the first annular sealing member 9a, in the second groove 5d.

The surface 7a of the second metal lid 7 may according to one variation be provided with a fourth groove 7d arranged radially inwards of the second groove 7b. The fourth groove 7d forms a closed loop extending around surface 7a. The fourth groove 7d is preferably elliptical. In this case, the pressure resistant housing 1 comprises a second annular inner sealing member 29 arranged to provide a fluid tight seal between the second metal lid 7 and the second opening 3b. The second annular inner sealing member 29 is arranged radially inwards of the second annular sealing member 9b, in the fourth groove 7d.

The pressure resistant housing 1 may for example be supported by an external support structure which is arranged to hold the first ceramic body 3.

Figure 2:
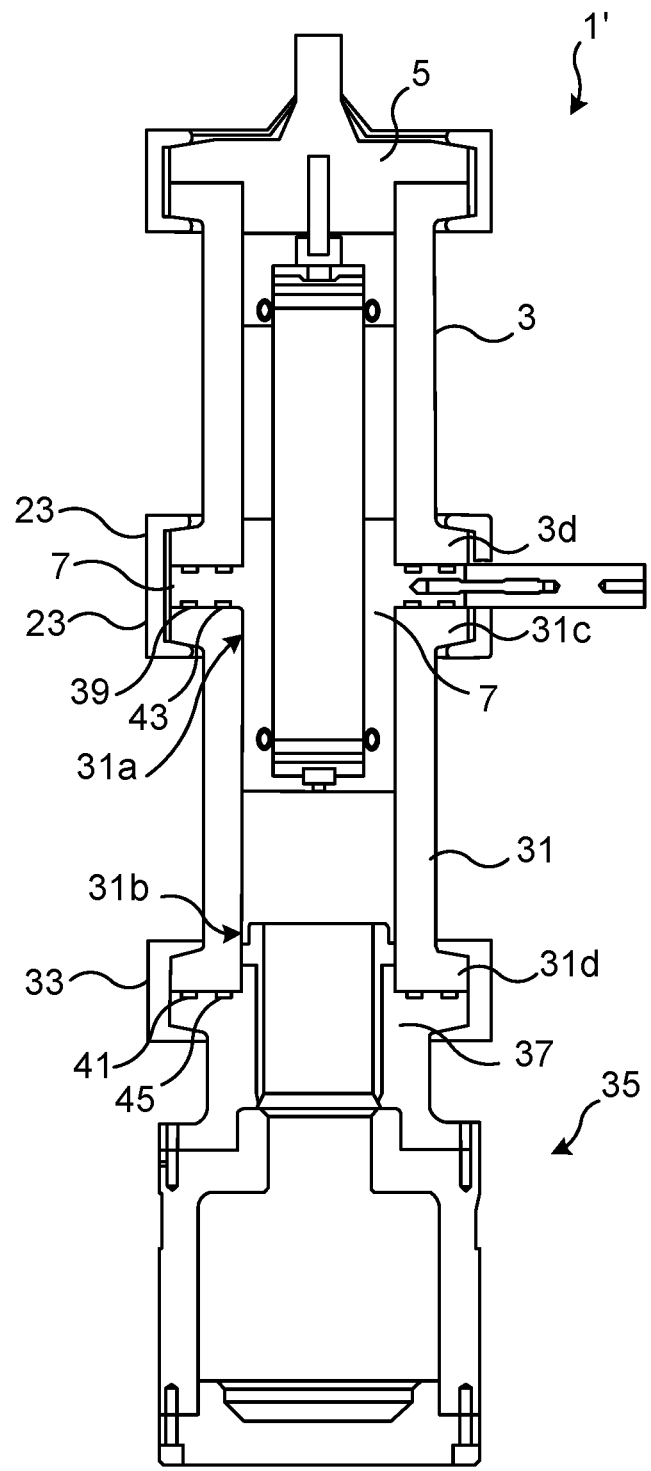
FIG. 2 schematically depicts a longitudinal section of a second example of a pressure resistant housing including an electric component.

With reference to FIG. 2 another example of a pressure resistant housing 1' is shown. Pressure resistant housing 1' is very similar in structure to the example shown in FIG. 1; the common structure will therefore not be repeated.

Pressure resistant housing 1' further comprises a second ceramic body 31 that is hollow and which has a third opening 31a and a fourth opening 31b, the third opening 31a and the fourth opening 31b being connected to each other through the hollow structure of the second ceramic body 31. The second ceramic body may essentially be identical to the first ceramic body 3. To this end, the second ceramic body 31 has a first end flange 31c at one end thereof, and a second end flange 31d at the opposite end of the second ceramic body 31.

The pressure resistant housing 1'1 furthermore comprises a third clamp 33 and a third annular sealing member 39. The third annular sealing member is arranged to provide a fluid tight seal between the second metal lid 7 and the third opening 31a. In this example, the second clamp 23 is arranged to additionally clamp the first ceramic body 3 to the second ceramic body 31, with the second metal lid 7 being arranged between the second end flange 3d of the first ceramic body 3 and the first end flange 31c of the second ceramic body 31.

The pressure resistant housing 1' may further include a support structure 35 to which the second ceramic body 31 may be mounted. In use, the support structure 35 generally has a different electric potential than the electric potentials of the first metal lid 5 and the second metal lid 7. The second ceramic body 31 provides electrical insulation between the metal lids 5, 7 and the support structure 35.

The pressure resistant housing 1' has a fourth annular sealing member 41 arranged to provide a fluid tight seal between the support structure 35 and the fourth opening 31b, and a third clamp 33 arranged to clamp the second ceramic body to the support structure 35. The support structure 35 may have an end flange 37 arranged to be clamped to the second end flange 31d of the second ceramic body 31 by means of the third clamp 33.

The third annular sealing member 39 and the fourth annular sealing member 41 are made of a flexible material, such as rubber or plastic, and they may for example be O-rings.

There may according to one variation be additional annular sealing members provided between the second metal lid 7 and the second ceramic body 31. There may for example be provided an annular inner sealing member 43 arranged radially inwards of the third annular sealing member 39. Similarly, there may be an annular inner sealing member 45 arranged radially inwards of the fourth annular sealing member 41, between the second end flange 31d of the second ceramic body 31 and the support structure 35.

According to any example presented herein the grooves arranged to receive first and second annular sealing members could instead be provided in the first end flange and the second end flange of the first ceramic body. The same also applies to the third and fourth annular sealing members, as well as any annular inner sealing member disclosed herein.

When the pressure resistant housing 1, 1' includes an electric component in the form of a fuse connected to the first metal lid 5 and the second metal lid 7, a subsea fuse is created. Furthermore, the subsea fuse can comprise a dielectric fluid. In particular, the space around the electric component 11 can be filled with a dielectric fluid e.g. a dielectric liquid such as oil or an ester, or a gas such as nitrogen or air, such that the electric component 11 is immersed in the dielectric fluid.

It is envisaged that the pressure resistant housings presented herein find use within high pressure applications such as subsea installations in the oil and gas industry, for example for subsea HVDC/HVAC power provision systems, i.e. power transmission and power distribution systems, offshore power generation such as wind energy, tidal energy, wave energy, and ocean current energy as well as variable speed drives for pumping or gas compression. In one particular application, the subsea fuse may be comprised in a subsea circuit breaker pole.

The inventive concept has mainly been described above with reference to a few examples. However, as is readily appreciated by a person skilled in the art, other embodiments than the ones disclosed above are equally possible within the scope of the inventive concept, as defined by the appended claims.

The invention claimed is:

1. A pressure resistant housing for an electric component, which pressure resistant housing is adapted for use in subsea applications, wherein the pressure resistant housing comprises:

a first ceramic body arranged to accommodate the electric component, which first ceramic body is provided with a first opening and a second opening, a first metal lid for closing the first opening, a first annular sealing member arranged to provide a fluid tight seal between the first metal lid and the first opening, a first clamp arranged to clamp the first metal lid to the first ceramic body, a second metal lid for closing the second opening, a second annular sealing member arranged to provide a fluid tight seal between the second metal lid and the second opening, and a second clamp arranged to clamp the second metal lid to the first ceramic body, wherein the first metal lid has a first bore arranged to receive a portion of the electric component, wherein the first bore has a first circumferential groove, wherein the first metal lid has a first flexible member arranged in the first circumferential groove, and wherein first flexible member is flexible in a radial direction and is arranged to provide mechanical contact between the electric component and the first metal lid to establish a mechanical and electrical connection between the electric component and the first metal lid, and wherein the second metal lid has a second bore arranged to receive a portion of the electric component, wherein the second bore has a second circumferential groove, wherein the second metal lid has a second flexible member arranged in the second circumferential groove, and wherein second flexible member is flexible in a radial direction and is arranged to provide mechanical contact between the electric component and the second metal lid to establish a mechanical and electrical connection between the electric component and the second metal lid.

2. The pressure resistant housing as claimed in claim 1, wherein the first ceramic body has a first end flange at a first end thereof, wherein the first clamp is arranged to clamp the first metal lid to the first end flange.

3. The pressure resistant housing as claimed in claim 1, wherein the first ceramic body has a second end flange at a second end thereof, wherein the second clamp is arranged to clamp the second metal lid to the second end flange.

4. The pressure resistant housing as claimed in claim 1, comprising a first annular inner sealing member arranged to provide a fluid tight seal between the first metal lid and the first opening, wherein the first annular inner sealing member is arranged radially inwards of the first annular sealing member.

5. The pressure resistant housing as claimed in claim 1, comprising a second annular inner sealing member arranged to provide a fluid tight seal between the second metal lid and the second opening, wherein the second annular inner sealing member is arranged radially inwards of the second annular sealing member.

6. The pressure resistant housing as claimed in claim 1, wherein the first clamp is annular.

7. The pressure resistant housing as claimed in claim 1, wherein the second clamp is annular, and which second clamp has a circumferential surface provided with a through-opening to provide radial access to the second metal lid.

8. The pressure resistant housing as claimed in claim 1, wherein the first annular sealing member and the second annular sealing member are O-rings.

9. The pressure resistant housing as claimed in claim 1, comprising:
- a second ceramic body provided with a third opening and a fourth opening,
- a third annular sealing member arranged to provide a fluid tight seal between the second metal lid and the third opening,
- wherein the second clamp is arranged to clamp the first ceramic body to the second ceramic body,
- a support structure,
- a fourth annular sealing member arranged to provide a fluid tight seal between the support structure and the fourth opening, and
- a third clamp arranged to clamp the second ceramic body to the support structure.

10. A subsea fuse comprising:
- a first ceramic body arranged to accommodate an electric component, which first ceramic body is provided with a first opening and a second opening,
- a first metal lid for closing the first opening,
- a first annular sealing member arranged to provide a fluid tight seal between the first metal lid and the first opening,
- a first clamp arranged to clamp the first metal lid to the first ceramic body,
- a second metal lid for closing the second opening,
- a second annular sealing member arranged to provide a fluid tight seal between the second metal lid and the second opening,
- a second clamp arranged to clamp the second metal lid to the first ceramic body; and
- wherein the electric component is in the form of a fuse connected to the first metal lid and to the second metal lid,
- wherein first metal lid has a first bore arranged to receive a portion of the electric component, wherein the first bore has a first circumferential groove, wherein the first metal lid has a first flexible member arranged in the first circumferential groove, and wherein first flexible member is flexible in a radial direction and is arranged to provide mechanical contact between the electric component and the first metal lid to establish a mechanical and electrical connection between the electric component and the first metal lid, and
- wherein the second metal lid has a second bore arranged to receive a portion of the electric component, wherein the second bore has a second circumferential groove, wherein the second metal lid has a second flexible member arranged in the second circumferential groove, and wherein second flexible member is flexible in a radial direction and is arranged to provide mechanical contact between the electric component and the second metal lid to establish a mechanical and electrical connection between the electric component and the second metal lid.

11. The subsea fuse as claimed in claim 10, wherein the pressure resistant housing comprises a dielectric fluid in which the electric component is immersed.

12. The pressure resistant housing as claimed in claim 2, wherein the first ceramic body has a second end flange at a second end thereof, wherein the second clamp is arranged to clamp the second metal lid to the second end flange.

13. The pressure resistant housing as claimed in claim 2, comprising a first annular inner sealing member arranged to provide a fluid tight seal between the first metal lid and the first opening, wherein the first annular inner sealing member is arranged radially inwards of the first annular sealing member.

14. The pressure resistant housing as claimed in claim 2, comprising a second annular inner sealing member arranged to provide a fluid tight seal between the second metal lid and the second opening, wherein the second annular inner sealing member is arranged radially inwards of the second annular sealing member.

* * * * *